US00RE41235E

(19) United States
(12) Reissued Patent
Miyada et al.

(10) Patent Number: US RE41,235 E
(45) Date of Reissued Patent: *Apr. 20, 2010

(54) PHASE LOCKED LOOP CIRCUIT

(75) Inventors: Yoshinori Miyada, Yokohama (JP); Seiji Watanabe, Kyoto (JP)

(73) Assignee: Panasonic Corporation, Osaka (JP)

( * ) Notice: This patent is subject to a terminal disclaimer.

(21) Appl. No.: 11/653,419

(22) Filed: Jan. 16, 2007

Related U.S. Patent Documents

Reissue of:
(64) Patent No.: 6,489,851
Issued: Dec. 3, 2002
Appl. No.: 09/721,874
Filed: Nov. 27, 2000

U.S. Applications:

(62) Division of application No. 10/635,534, filed on Aug. 7, 2003, now Pat. No. Re. 39,807.

(30) Foreign Application Priority Data

Nov. 26, 1999 (JP) ..... 11-335841

(51) Int. Cl.
*H03L 7/00* (2006.01)

(52) U.S. Cl. ..... 331/11; 331/25; 331/1 R; 331/34; 331/177 R; 327/156

(58) Field of Classification Search ..... 331/11, 331/34, 1 R, 25, 177 R; 327/156
See application file for complete search history.

(56) References Cited

U.S. PATENT DOCUMENTS

| | | | |
|---|---|---|---|
| 4,766,397 | A | 8/1988 | Adams |
| 5,633,766 | A | 5/1997 | Hase et al. |
| 5,686,849 | A | 11/1997 | Burzio |
| 6,088,311 | A | 7/2000 | Katoh |
| 6,147,530 | A | 11/2000 | Nogawa |

*Primary Examiner*—Arnold Kinkead
(74) *Attorney, Agent, or Firm*—Wenderoth, Lind & Ponack, L.L.P.

(57) ABSTRACT

A PLL circuit comprises a frequency comparator for detecting a phase difference based on a difference in frequencies between a reproduced data pulse and a clock generated by a VCO; a phase comparator for detecting a difference in phases between the reproduced data pulse and the VCO clock; a selector for selectively outputting a signal supplied from the frequency comparator, a first charge pump for increasing/decreasing the output voltage on the basis of the output from the selector; a second charge pump for increasing/decreasing the output voltage on the basis of the output from the phase comparator; a loop filter for eliminating unnecessary components included in a signal obtained by adding the output from the first charge pump and the output from the second charge pump; and a VCO for generating a clock of a frequency corresponding to the output voltage of the loop filter. In this PLL circuit, when the phase difference between the reproduced data pulse and the VCO clock is within the pull-in range of the phase comparator, the operation of the frequency comparator is restricted by the output of the phase comparator. Therefore, the PLL circuit can perform stable data reading even when the reproduced data pulse has a large amount of clock jitter.

2 Claims, 3 Drawing Sheets

PHASE LOCKED LOOP CIRCUIT

Matter enclosed in heavy brackets [ ] appears in the original patent but forms no part of this reissue specification; matter printed in italics indicates the additions made by reissue.

*This is a reissue application of U.S. Pat. No. 6,489,851, issued Dec. 3, 2002, and a divisional application of U.S. Reissued Pat. No. RE39,807, issued Sep. 4, 2007.*

FIELD OF THE INVENTION

The present invention relates to a phase locked loop circuit (hereinafter referred to as "PLL-circuit") for generating an output signal having no lags in frequency and phase from those of an input signal, which is used in a magnetic disk unit such as an optic disk unit.

BACKGROUND OF THE INVENTION

A recent CD (Compact Disk) player is capable of normal-speed playback when reading audio data from a CD, and 32X-speed playback when reading computer data from a CD. In such a CD player capable of playing both of a CD containing audio data and a CD containing computer data, when playing the disk at 32X speed, the maximum frequency of the reproduced data pulse read from the disk of the reproduced data pulse read from the disk becomes 32 times as high as that at the normal-speed playback and, therefore, the frequency of a clock generated in phase-synchronization with the reproduced data also becomes 32 times as high as that at the normal-speed playback. That is, the frequency bands of clocks handled by one CD player extend widely.

Further, in the CD player capable of the high-speed playback mentioned above, there is a difference in the maximum frequency components of the reproduced data pulses between playback of data recorded on the inner radius of the disk and playback of data recorded on the outer radius of the disk.

For this reason, the range of frequencies oscillated by a VCO (Voltage Controlled Oscillator), which is provided in a PLL circuit for generating a clock to read disk data, is also wide.

Accordingly, a PLL circuit included in the CD player having the above-mentioned high-speed playback function is required to quickly respond to a wide range of frequency bands handled in the CD player, and conventionally, a PLL circuit provided with a frequency comparator is employed to meet this requirement. FIG. 3 shows a PLL circuit provided with a frequency comparator (hereinafter referred to as "PLL circuit X").

The conventional PLL circuit X comprises a frequency comparator 1, a phase comparator 2, a first charge pump 4, and second charge pump 5, a loop filter 6 and a VCO 7.

The frequency comparator 1 included in the conventional PLL circuit X brings a clock generated by the VCO 7 up to a range where the phase comparator 2 can synchronize the phase of the reproduced data pulse and the phase of the clock generated by the VCO 7, i.e., a range where the phase comparator 2 can lock the phases. Once the phases are locked, the clock generated by the VCO 7 is prevented from being adversely affected by the output of the frequency comparator, using a signal to the half the operation of the frequency comparator 1.

In the aforementioned PLL circuit X, however, since the range of adaptable frequency bands is broad, fluctuations in the output from the first charge pump 4 for controlling the VCO 7 according to the output of the frequency comparator 1 are increased, whereby the range of fluctuations in the output from the loop filter 6 for smoothing the output of the first charge pump 4 becomes wide, resulting in an unstable PLL circuit.

To be specific, the frequency of the clock generated by the VCO 7 changes in proportion with the output voltage of the loop filter 6. So, in order to bring the clock generated by the VCO 7 into phase-synchronization with the reproduced data pulse quickly, the frequency of the clock generated by the VCO 7 must be increased or decreased quickly in a stroke.

Furthermore, when the reproduced data pulse has a large amount of jitter, the frequency comparator 1 generates jitters in the clock generated by the VCO 7 in response to the clock jitters of the reproduced data pulse. As the result, the phase comparator 2 cannot lock the phases.

SUMMARY OF THE INVENTION

The present invention is made to solve the above-described problems and has for its object to provide a PLL circuit which can limit the operation of a frequency comparator with its output when a difference in phases between reproduced data pulse and VCO clock is in the pull-in range of the phase comparator, and lock the phases even when the reproduced data pulse has a large amount of jitter, thereby performing stable data reading.

Other objects and advantages of the invention will be apparent from the detailed description that follows. The detailed description and specific embodiments described are provided only for illustration since various additions and modifications within the scope of the invention will be apparent to those skilled in the art from the detailed description.

According to a first aspect of the present invention, there is provided a PLL circuit used in a magnetic disk unit, which generates a clock in phase-synchronization with a reproduced data pulse read from the magnetic disk. The phase locked loop circuit comprises a frequency comparator for detecting a phase difference based on a difference in frequencies between the reproduced data pulse and the clock, and outputting a frequency error level which is the result of detection, as a frequency comparison error signal; a phase comparator for detecting a difference in phases between the reproduced data pulse and the clock; a selector for outputting the frequency comparison error signal as it is when the frequency error level is relatively large, and thinning the frequency comparison error signal to be output when the frequency error level is relatively small; a first charge pump for increasing/decreasing the output voltage on the basis of the output from the selector; a second charge pump for increasing/decreasing the output voltage on the basis of the output from the phase comparator; a loop filter for eliminating unnecessary components included in a signal obtained by adding the output from the first charge pump and the output from the second charge pump; and a voltage controlled oscillator for generating a clock of a frequency corresponding to the output voltage of the loop filter. Therefore, even when the reproduced data pulse has a large amount of clock jitter, a PLL circuit capable of speedy and stable data reading operation is obtained.

According to a second aspect of the present invention, in the above-described PLL circuit, the frequency comparator detects phase sections of the clock corresponding to a leading edge and a trailing edge of the reproduction data pulse to perform frequency comparison, and outputs the result of comparison as a frequency comparison error signal; and the selector thins the frequency comparison error signal to be output when there is a change between specific phase sections of the clock, which correspond to the leading edge and trailing edge of the reproduced data pulse, respectively, and are detected by the frequency comparator. Therefore, assuming that the phase sections of the clock are "0", "1", "2", and "3", when the phase section of the clock corresponding to the data edge changes from "1" to "0", or from "0" to "1", the edge of the reproduced data pulse is regarded as being fluctuated by signal jitter. In this case, the output from the frequency comparator is controlled so as not to fluctuate the frequency of the VCO, whereby unnecessary frequency fluctuation does not occur in the output of the VCO, resulting in stable data reproduction.

DETAILED DESCRIPTION OF THE PREFERRED EMBODIMENT

Hereinafter, a PLL circuit according to an embodiment of the present invention will be described with reference to the drawings.

Figure 1:
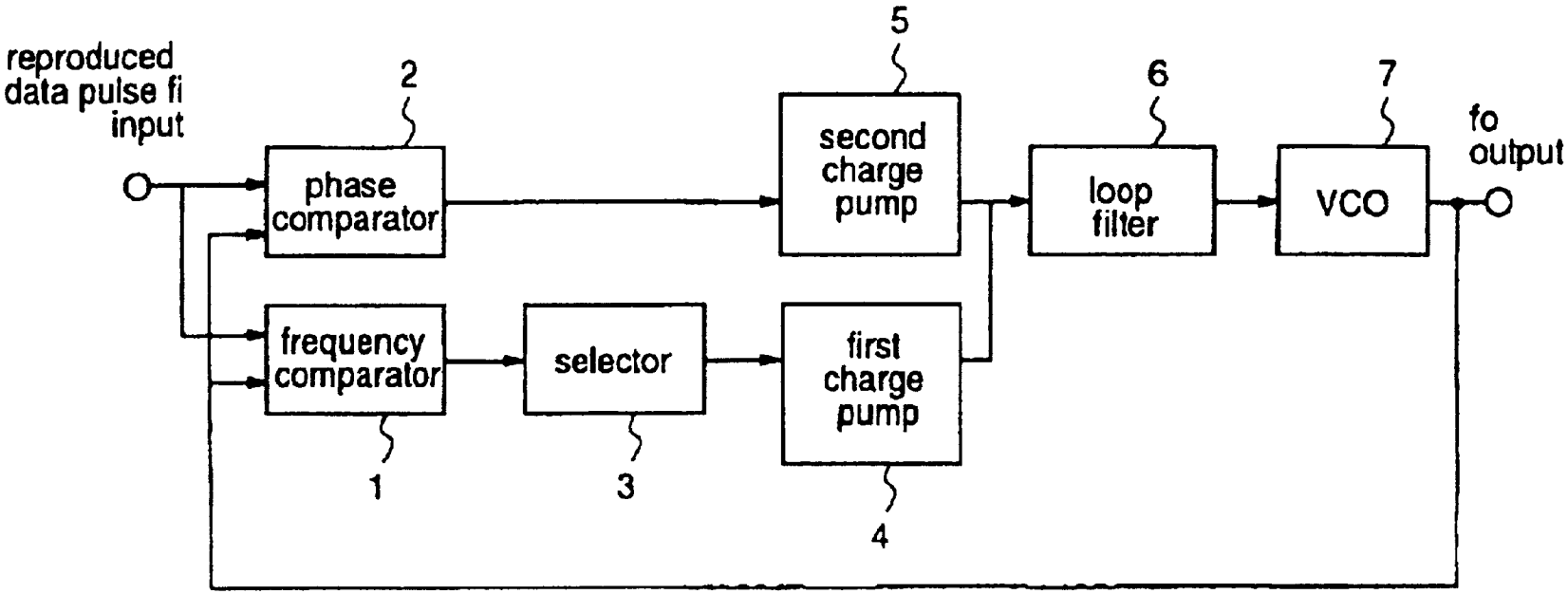
FIG. 1 is a block diagram illustrating a PLL circuit according to an embodiment of the invention.

FIG. 1 is a block diagram illustrating a PLL circuit A according to an embodiment of the invention.

This PLL circuit A comprises a frequency comparator 1, a phase comparator 2, a selector 3, a first charge pump 4, a second charge pump 5, a loop filter 6, and a VCO 7. The frequency comparator detects a phase difference based on a difference in frequencies between a reproduced data pulse and a clock generated by the VCO 7 (hereinafter referred to as "VCO clock"), and outputs the result as a frequency comparison error signal. The phase comparator 2 detects a difference in phases between the reproduced data pulse and the VCO clock. The selector 3 thins the frequency comparison error signal to be output, on the basis of the frequency error indicated by the frequency comparison error signal outputted from the frequency comparator 1. The first charge pump 4 increases or decreases the output voltage on the basis of the output from the selector 3. The second charge pump 5 increases or decreases the output voltage on the basis of the output from the phase comparator 2. The loop filter 6 eliminates unnecessary components included in a signal obtained by adding the output from the first charge pump 4 and the output from the second charge pump 5. The VCO 7 generates a clock of a frequency corresponding to the output voltage of the loop filter 6. The phase comparator 2 is constituted by, for example, EX-OR circuits and RS flip-flop circuits.

Next, the operation of the PLL circuit A so constructed will be described.

Initially, the frequency comparator 1 compares the frequency of the reproduced data pulse with the frequency of the VCO clock, and outputs an error obtained as the result of the comparison, as a frequency comparison error signal.

The frequency comparison error signal outputted from the frequency comparator 1 is input to the selector 3. In the selector 3, the inputted frequency comparison error signal is appropriately selected to be output to the first charge pump 4, according to the frequency error level of the frequency comparison error signal. To be specific, among the frequency comparison error signals outputted from the frequency comparator 1, the selector 3 outputs the frequency comparison error signals having relatively large error levels as they are to the first charge pump 4, and thins, i.e., prevents, the frequency comparison error signals having relatively small error levels from being output to the first charge pump.

Although it is not shown in the figure, the function of the selector 3 may be included in the frequency comparator 1. For example, assuming that the frequency comparison errors are classified into eight levels, only the error signals of the upper four levels in descending order are output from the frequency comparator 1. Thereby, the circuit scale of the frequency comparator 1 can be reduced.

Next, the frequency comparison error signal selected by the selector 3 is input to the first charge pump 4. The first charge pump 4 increases or decreases the output voltage according to the inputted error signal, whereby a pulse increasing the frequency (hereinafter referred to as "up pulse") or a pulse decreasing the frequency (hereinafter referred to as "down pulse") is generated.

Next, the phase comparator 2 compares the phase of the reproduced data pulse with the phase of the VCO clock, and a phase difference detected is output as a phase error signal to the second charge pump 5.

Then, the second charge pump 5 increases or decreases the output voltage according to the phase error signal supplied from the phase comparator 2, thereby generating an up pulse or a down pulse.

The up pulse or down pulse outputted from the first charge pump 4 is added to the up pulse or down pulse outputted from the second charge pump 5, and the sum is input to the loop filter 6.

The loop filter 6 eliminates unnecessary components from the signal obtained by adding the outputs of the first and second charge pumps 4 and 5.

The output from the loop filter 6 is a control voltage for the VCO 7, and the VCO 7 generates a clock of a frequency corresponding to the output voltage of the loop filter 6.

Hereinafter, the operation of the frequency comparator 1 included in the PLL circuit A will be described with reference to FIG. 2 and table 1. The frequency comparator 1 performs frequency comparison by detecting phase sections of the VCO clock corresponding to the leading edge and trailing edge of the reproduced data pulse.

TABLE 1

| phase change at data edge | output from frequency comparator 1 acceleration/ deceleratin signal | output signal signal from selector 3 acceleration/ deceleration signal | VCO frequency change due to output from frequency comparator |
|---|---|---|---|
| 0 → 0 | no signal | no signal | no change |
| 0 → 1 | deceleration | no signal | no change |
| 0 → 3 | acceleration | acceleration | acceleration |
| 1 → 0 | acceleration | no signal | no change |
| 1 → 1 | no signal | no signal | no change |
| 1 → 2 | deceleration | deceleration | deceleration |
| 2 → 1 | acceleration | acceleration | acceleration |
| 2 → 2 | no signal | no signal | no change |

TABLE 1-continued

| phase change at data edge | output from frequency comparator 1 acceleration/ deceleratin signal | output signal signal from selector 3 acceleration/ deceleration signal | VCO frequency change due to output from frequency comparator |
|---|---|---|---|
| 2 → 3 | deceleration | deceleration | deceleration |
| 3 → 0 | deceleration | deceleration | deceleration |
| 3 → 2 | acceleration | acceleration | acceleration |
| 3 → 3 | no signal | no signal | no change |

Figure 2:
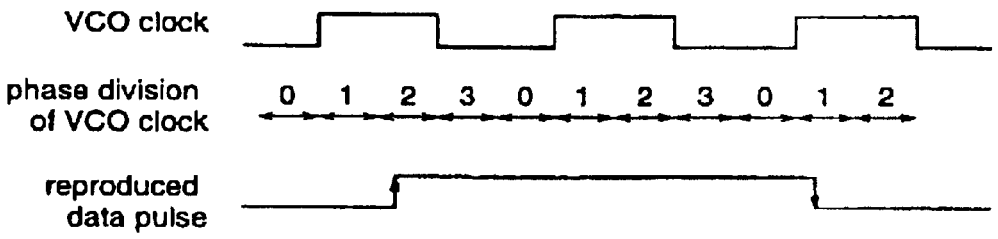
FIG. 2 is a timing chart for explaining the operation of a frequency comparator according to the embodiment of the invention.
Figure 3:
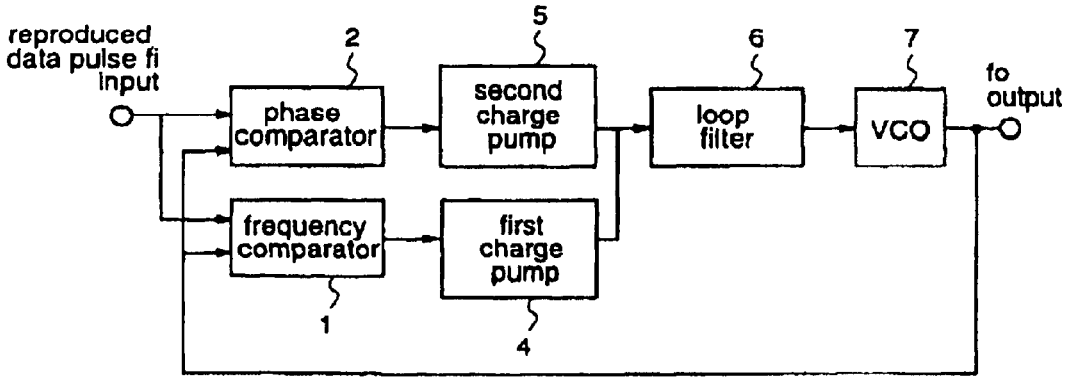
Fig.3 Prior Art
FIG. 3 is a block diagram illustrating a PLL circuit according to the prior art.

FIG. 2 shows the reproduced data pulse, the VCO clock, and the phase sections of the VCO clock ("0", "1", "2", and "3" in the figure), and the relationship in phases between the reproduction data pulse and the VCO clock. Table 1 shows the outputs from the frequency comparator 1 and the outputs from the selector 3, wherein are generated according to the relationship in phases between the reproduced data pulse and the VCO clock.

In the PLL circuit A shown in FIG. 1, the frequency comparator 1 performs detection of the phase sections of the VCO clock corresponding to the leading edge and trailing edge of the reproduced data pulse.

This detection will be described with reference to FIG. 2. Since the phase of the edge of the reproduced data pulse changes from the section "2" to the phase section "1", a signal for accelerating the frequency of the VCO 7 is generated in both of the output of the frequency comparator 1 and the output of the selector 3, whereby the frequency of the VCO 7 is accelerated.

Further, when the phase at the data edge changes from the phase section "0" to the phase section "1", a signal for decelerating the frequency of the VCO 7 is output from the frequency comparator 1 while a signal for neither accelerating nor decelerating the frequency of the VCO 7 is output from the selector 3.

Moreover, when the edge of the reproduced data pulse changes from the phase section "1" to the phase section "0", a signal for accelerating the frequency of the VCO 7 is output from the frequency comparator 1 while a signal for neither accelerating nor decelerating the frequency of the VCO 7 is output from the selector 3.

Then, the phase-relationships with the VCO clock are compared between the adjacent two edges of the reproduced data pulse. With reference to table 1, when the difference is "0",or when the phase section changes from "0" to "1", or when it changes from 37 1" to "0", the selector 3 functions so that the frequency error signal from the frequency comparator 1 is not input to the charge pump 4.

As described above, according to the present invention, the frequency comparator 1 detects the phase sections of the clock generated by the VCO 7 corresponding to the leading edge and trailing edge of the reproduced data pulse, and when the detected phase sections change from "1" to "0" or from 37 0" to "1", the selector 3 thins, i.e., does not output some of the signals supplied from the frequency comparator 1 and outputs the remaining signals, to the VCO 7. Therefore, when the reproduced data pulse fluctuates due to signal jitter, the output from the frequency comparator 1 does not become a signal which fluctuates the frequency of the VCO 7, and unnecessary frequency fluctuation does not occur in the output of the VCO 7. Therefore, even when a signal having a large amount of clock jitter is reproduced, the data reproduction operation is stabilized.

What is claimed is:

[1. A phase locked loop circuit, for use in a magnetic disk unit that generates a clock signal in phase-synchronization with a reproduced data pulse read from a magnetic disk, said phase locked loop circuit comprising:

a frequency comparator operable to detect a difference in frequencies between the reproduced data pulse and the clock signal, and to output a frequency comparison error signal based on the difference, said frequency comparison error signal indicating a frequency error level;

a phase comparator operable to detect a difference in phases between the reproduced data pulse and the clock signal and to produce an output based on the difference;

a selector operable to output said frequency comparison error signal when the frequency error level indicated by said frequency comparison error signal is greater than or equal to a predetermined value and to prevent outputting of said frequency comparison error signal when the frequency error level indicated by said frequency comparison error signal is less than the predetermined value;

a first charge pump operable to output a first voltage, and to increase or decrease the first voltage based on the output of said selector;

a second charge pump operable to output a second voltage, and to increase or decrease the second voltage based on the output of said comparator;

a loop filter operable to eliminate unnecessary components included in a sum of the outputs of said first and second charge pumps and to produce a filtered output voltage; and a voltage controlled oscillator operable to generate a clock of a frequency corresponding to the filtered output voltage from said loop filter.]

[2. A phase locked loop circuit according to claim 1 wherein:

the clock signal has phase sections;

said frequency comparator is operable to detect which phase section of the clock signal corresponds to a leading edge of the reproduced data pulse and which phase section corresponds to a trailing edge of the reproduced data pulse, compare the phase section of the clock signal that corresponds to the leading edge of the reproduced data pulse and the phase section of the clock signal that corresponds to the trailing edge of the reproduced data pulse, and to output a result of the comparison as a frequency comparison error signal; and said selector does not output the frequency comparison error signal when the phase section that corresponds to the leading edge of the reproduced data pulse and the phase section that corresponds to the trailing edge of the reproduced data pulse are detected by said frequency comparator to be specific predetermined values.]

*3. A phase locked loop circuit for generating a clock signal in phase-synchronization with an input data pulse, said phase locked loop circuit comprising:*

*a frequency comparator operable to detect a difference in frequencies between the input data pulse and the clock signal, and to output a frequency comparison error signal based on the difference, the frequency comparison error signal indicating a frequency error level; and*

*an output selectable circuit operable to output the frequency comparison error signal when the frequency error level indicated by the frequency comparison error signal is greater than or equal to a predetermined value and to prevent outputting of the frequency comparison error signal when the frequency error level indicated by the frequency comparison error signal is less than the predetermined value, wherein:*

*said frequency comparator is operable to detect the difference by checking a phase section of the clock signal at an edge of the input data pulse.*

*4. A phase locked loop circuit according to claim 3, wherein:*

*the phase section is detected corresponding to a leading edge and a trailing edge of the input data pulse.*

* * * * *